(12) United States Patent
Houston

(10) Patent No.: US 6,429,684 B1
(45) Date of Patent: Aug. 6, 2002

(54) CIRCUIT HAVING DYNAMIC THRESHOLD VOLTAGE

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/163,267

(22) Filed: Sep. 29, 1998

Related U.S. Application Data

(60) Provisional application No. 60/061,128, filed on Oct. 6, 1997.

(51) Int. Cl.[7] .......................................... H03K 19/0185

(52) U.S. Cl. .............................. 326/83; 326/81; 326/87; 327/534

(58) Field of Search .............................. 326/80, 81, 83, 326/86, 87, 93, 95; 327/534, 535

(56) References Cited

U.S. PATENT DOCUMENTS

| 5,552,723 A | * | 9/1996 | Shigehara et al. ............. 326/86 |
| 5,644,266 A | * | 7/1997 | Chen et al. .................... 326/27 |
| 5,748,016 A | * | 5/1998 | Kurosawa ..................... 326/27 |

OTHER PUBLICATIONS

Kuroda, et al., "Variable Supply–Voltage Scheme for Low–Power High–Speed CMOS Digital Design," IEEE Journal of Solid–State Circuits, vol. 33, No. 3, Mar. 1998.

* cited by examiner

Primary Examiner—Michael Tokar
Assistant Examiner—Don Phu Le
(74) Attorney, Agent, or Firm—W. James Brady, III; Frederick J. Telecky, Jr.

(57) ABSTRACT

A body-tied-to-drain transistor having significantly reduced gate delay and being particularly appropriate for large drivers where a series of inverters is used. The basic configuration ties the drain of the transistor to the body of the transistor when the transistor is turned on, and is disconnected when the transistor is turned off.

9 Claims, 9 Drawing Sheets

CIRCUIT HAVING DYNAMIC THRESHOLD VOLTAGE

CROSS-REFERENCE TO RELATED APPLICATION

This application claims priority from 60/061,128, filed Oct. 6, 1997, which is hereby incorporated by reference. However, the content of the present application is not necessarily identical to that of the priority application.

BACKGROUND AND SUMMARY OF THE INVENTION

The present application relates to a drain-to-body-tie configuration that significantly reduces gate delay and is particularly appropriate for large drivers where a series of inverters is used.

It is a well known dilemma that as supply voltages are scaled lower, CMOS threshold voltages must also be scaled lower to maintain performance, leading to increased sub-threshold leakage. One solution to mitigate the trade-off between high performance and low standby current is to modulate the threshold voltage ($V_t$) by control of the well or body voltage, lowering the $V_t$ in active mode and raising the $V_t$ in standby mode. Silicon-on-insulator (SOI) is particularly well suited for this because of its relatively low body capacitance, and its wider practical range of body versus well voltage. Developing circuit techniques to leverage this advantage may be critical to the successful commercialization of SOI technology.

Field effect transistors fabricated on a semiconductor substrate contain an inherent parasitic bipolar transistor, as illustrated in FIG. 2. U.S. Pat. No. 5,498,882. Transistor body potential has an influence on threshold voltage, affecting both drive current and leakage current. This is referred to as the body effect. Methods have been proposed in the past to make use of the body effect to modulate the threshold voltage of field effect transistors.

For floating body partially depleted SOI, there is an inherent $V_t$ modulation which lowers the $V_t$ when the individual transistor is turned on and raises the $V_t$ when the transistor is turned off. This modulation is due to the capacitive coupling of the gate to the body of the transistor. However, this effect is hysteretic with floating body SOI, resulting in an unstable threshold voltage.

One approach is to directly connect the gate to the body node, as taught in J-P. Colinge, *IEEE Trans. Electron Devices*, vol. ED-34, no. 4, pp. 845–49, April 1987, and F. Assaderagi et al., *A Dynamic threshold Voltage MOSFET (DTMOS) for Ultra-Low Voltage Operation*, 1994 IEDM Digest, pp. 809–12, December 1994, both of which are hereby incorporated by reference. This incurs the problem of gate current unless supply voltages are restricted to approximately 0.5 volt or less. Various approaches have been proposed to limit the gate current, but these are cumbersome or restrictive.

In another configuration, the body node is connected to the drain, where the connection is through a transistor gated by the primary transistor input voltage, as taught in U.S. Pat. No. 5,498,882 to T. W. Houston, issued March 1996, and I-Y. Chung et al., 1996 IEEE Int. SOI Conf., pp. 20–21, October 1996, both of which are hereby incorporated by reference. The body-to-drain configuration derives the benefit of dynamic $V_t$ without gate current and without restriction on operating supply voltage.

Circuit Having Dynamic Threshold Voltage

The present application discloses a modification of the drain-to-body configuration that significantly reduces gate delay and is particularly appropriate for large drivers where a series of inverters is used. The basic configuration is to tie the drain of the transistor to the body of the transistor when the transistor is turned on, and to disconnect it when the transistor is off. Referring particularly to n-channel transistors, when the transistor is off, the drain voltage will generally be high. Thus, if the drain is connected to the body of the transistor when it transitions from off to on, the drain voltage will raise the body voltage, thereby lowering $V_t$ and increasing the transistor current. The drain to body current will further aid in lowering the drain voltage. As the drain voltage comes down, the body voltage will also be lowered, preparing the transistor for the next on-to-off transition. Advantages of the disclosed methods and structures include the efficient control of the body voltage of a field effect transistor.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Body-Tied-To-Drain

Figure 3:
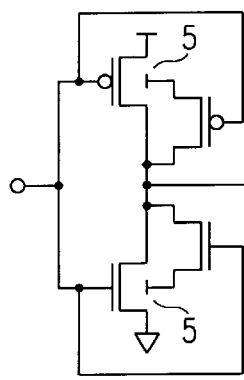
FIG. 3 shows a drain-to-body connection having a like-channel transistor, in accordance with the prior art.
Figure 4A:
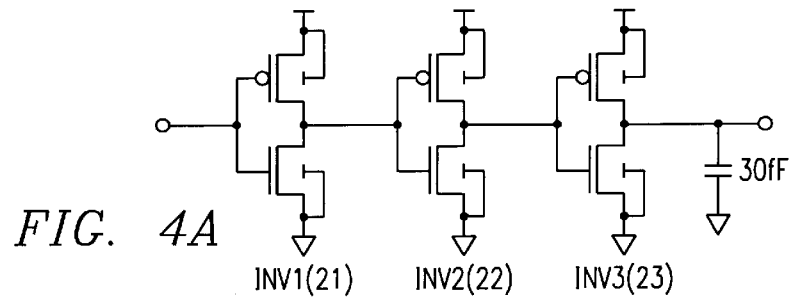
FIGS. 4A–D are circuits used in simulation of a configuration of the present invention contrasted with the prior art.
Figure 4B:
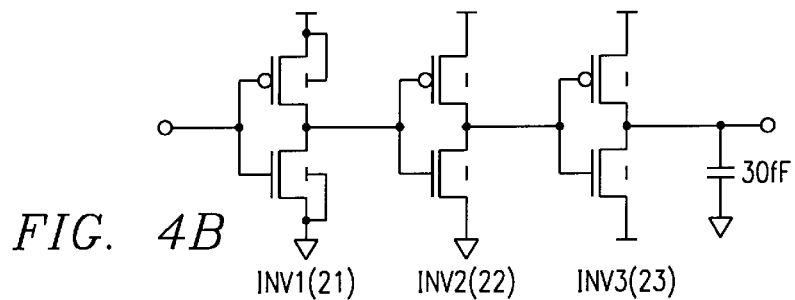
Figure 4C:
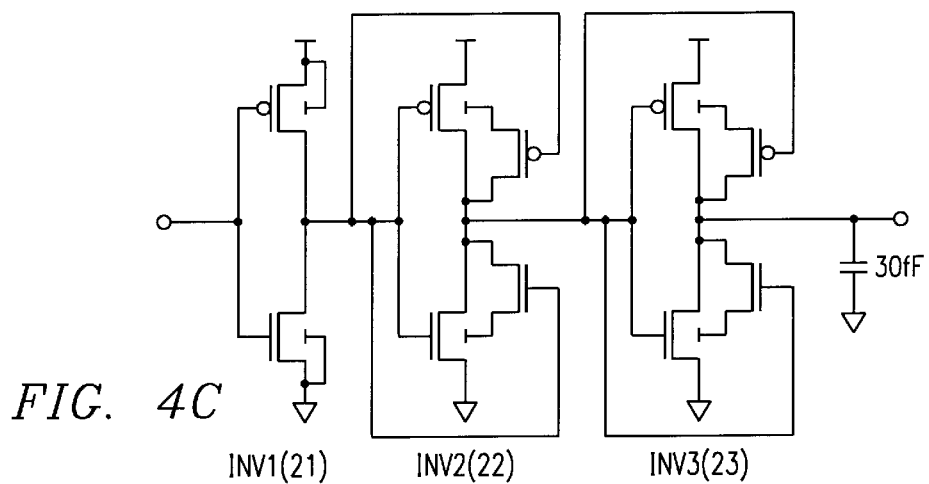
Figure 4D:
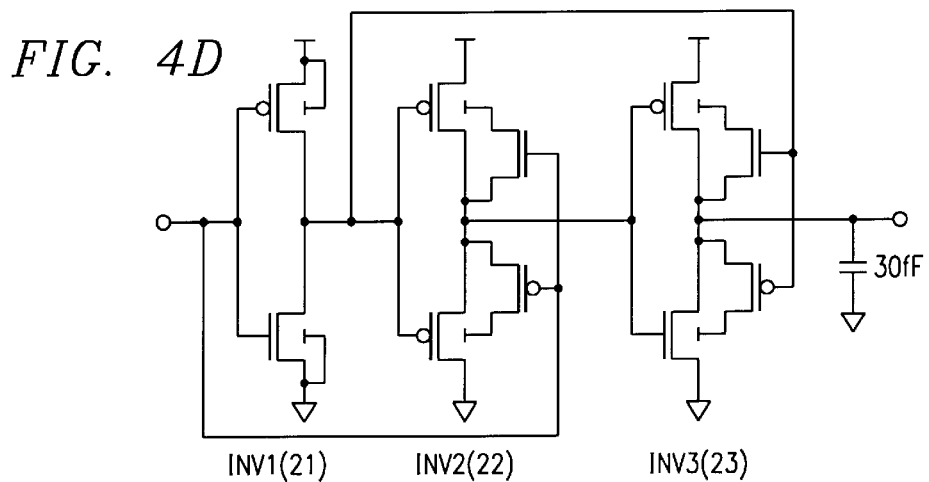

In a prior art configuration, as shown in FIG. 3, the drain-to-body connection 5 is accomplished with a like-channel transistor (n-channel for n-channel, p-channel for p-channel) gated by the primary input. This configuration, herein referred to as a "smart" body-tied-to-drain configuration, has the disadvantage of pulling the n-channel transistor body high through an n-channel transistor and pulling the p-channel transistor low through a p-channel transistor. Also, the delay in modulating the body voltage may be comparable to the primary gate delay.

Figure 1A:
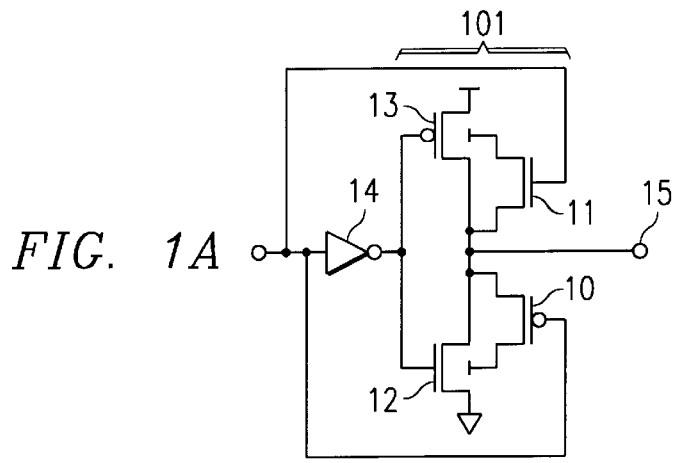
FIG. 1A illustrates two series-connected inverters in accordance with an embodiment of the present invention.

FIG. 1A illustrates two series-connected inverters in accordance with an embodiment of the present invention. For large drivers, it is usual to use a series of inverters to build up from the small device widths used for logic to the large device widths of the drivers. With series-connected inverters, it is possible to use the input of the first inverter 14 to gate the transistors (10 and 11) that connect the output of the second inverter 15 to the bodies of the associated transistors (12 and 13) of the second inverter 101.

Figure 1B:
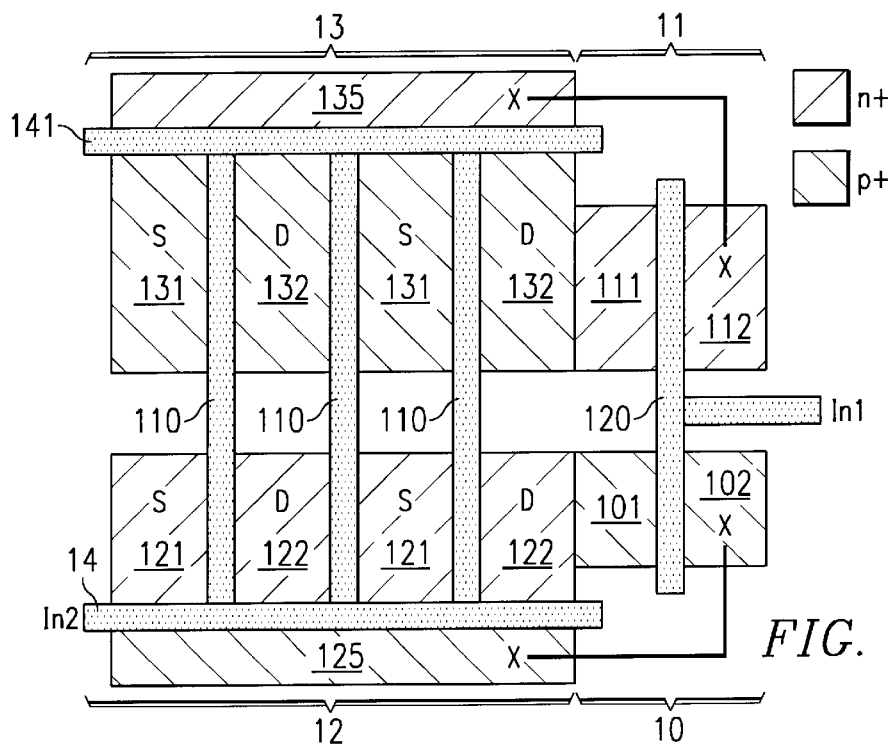
FIG. 1B is a top view of the second inverter 101 from FIG. 1A.

FIG. 1B illustrates a top layout view of the second inverter 101. In this embodiment, each of the logic transistors 12 and 13 has multiple active segments. Each of the gate lines 110 separates an NMOS source diffusion 121 from an NMOS drain diffusion 122, and also separates a PMOS source diffusion 131 from a PMOS drain diffusion 132. (Contacts, not shown, provide the output connection to the drain diffusions 122 and 132.) One NMOS drain 122 (of the n-MOS logic transistor 12) is connected to an adjacent P+ diffusion 101 (which forms the source of a p-MOS body-tie transistor 10) by a silicided surface layer. The drain 102 of the p-MOS body-tie transistor 10 is then ohmically connected to a p-type diffusion 125, which provides a connection to the body of the n-MOS logic transistor 12. Similarly, one of the drain diffusions 132 of the p-MOS logic transistor 13 is ohmically connected to the source 111 of the n-MOS body-tie transistor 11 by a surface silicide layer. The drain 112 of the n-MOS body-tie transistor is ohmically connected to a diffusion 135, which provides contact to the n-type body of the p-MOS logic transistor 13. Metallization is connected to the drains 122 and 132 of the two logic transistors 12 and 13 to connect the output of inverter 101 to other circuits. The horizontal portions 141 of the gate level provide an underlap between the body-connect diffusions 125/135 and the adjacent source/drain diffusions. By laying out the transistors in this fashion, the circuit becomes more compact and therefore takes up less space on an integrated circuit chip.

As shown by the layout view in FIG. 1B, opposite type transistors are used to connect the drains to the bodies of the transistors. That is, a p-channel body-tie transistor 10 is used to connect the drain 122 to the body 125 of the n-channel logic transistor 12, and an n-channel body-tie transistor 11 is used to connect the drain 132 to the body 135 of the p-channel logic transistor 13. A circuit using body-to-drain-tie transistors of opposite polarity as respective primary transistors which are gated by the inverse of the primary transistor gate signal is herein referred to as a "smarter" BTD configuration.

This configuration has two primary advantages over the prior art configuration shown in FIG. 3. First, the body nodes are pulled to the drain voltage in anticipation of the transistors being turned on, increasing the initial drive current. Second, the n-channel body voltage is more effectively pulled high through a p-channel transistor, and analogously, the p-channel body voltage is more effectively pulled low through an n-channel transistor. Thus, a greater dynamic $V_t$ shift is obtained.

For the n-channel primary transistor 12 of FIG. 1A, the body voltage when switching frequently will be higher (lowering VT and increasing switching speed) than can be achieved using the prior art configuration of FIG. 3, but it will also incur more leakage current. If left dormant for longer periods, e.g. milliseconds, the n-channel primary transistor 12 body of FIG. 1A will drift to a lower voltage, thereby lowering leakage to the same level as would be present in the prior art configuration of FIG. 3. The ability to shift VT to dynamically optimize the transistor for high-speed or low leakage operation provides an advantage over simply using a fixed-body transistor.

Figure 2:
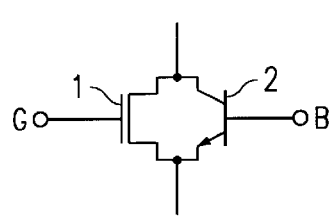
FIG. 2 is a drawing illustrating a prior art field effect transistor and its parasitic bipolar transistor.

In order to evaluate the circuit generally described above, simulations were run for a variety of configurations of three series-connected inverters as shown in FIGS. 4 A–D, with the third inverter driving a capacitance of 30 fF. In all cases, the first inverter 21 was built with body ties to source transistors. In case 1, illustrated in FIG. 4A, the second inverter 22 and the third inverter 23 had their bodies tied to source. In case 2, illustrated in FIG. 4B, the second inverter 22 and the third inverter 23 had their body floating. In case 3, illustrated in FIG. 4C, the second inverter 22 and the third inverter 23 had their bodies tied to drain according to the prior art of FIG. 2. In case 4, illustrated in FIG. 4D, the second inverter 22 and the third inverter 23 had their bodies tied to drain according to the present invention, as is shown in FIG. 1. The length of all transistors was 0.5 μm, the width of the body tie transistors was 0.5 μm, and the widths of the inverter transistors were as follows:

|  | $W_n$ (μm) | $W_p$ (μm) |
| --- | --- | --- |
| Inverter 1 | 1.7 | 3.3 |
| Inverter 2 | 5.0 | 10.0 |
| Inverter 3 | 15.0 | 30.0 |

The results are summarized in the following table and clearly show the significant advantage of the body-tied-to-drain configuration of the present invention.

| Type | Delay (psec) | |
|---|---|---|
|  | $V_{DD} = 1.5$ V | $V_{DD} = 1.0$ V |
| Fixed (1) | 295 | 630 |
| Floating (2) | 230 to 250 | 430 to 525 |
| BTD (3) | 245 | 515 |
| BTD (4) | 190 | 350 |

Body-Tied-To-Drain in Conjunction with Body-Tied-To-Source

Earlier publications proposed tying the body of an n-channel SOI transistor to the source through a p-channel transistor gated by the source signal of the primary transistor. This will be referred to herein as a "smart" body-tied-to-source (BTS) configuration. This "smart" BTS reduces leakage current by lowering the body voltage when the main transistor is off, thereby raising VT. It also eliminates the dependence of the body voltage on previous switching history (hysteretic behavior) that occurs if the body slowly drifts to an equilibrium value when left floating. Also proposed in the prior art is a circuit tying the body of an n-channel transistor to its drain through an n-channel transistor gated by the source signal of the primary transistor.

Figure 5A:
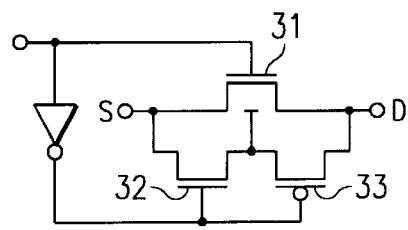
FIGS. 5A–B are n-channel transistors including the present invention.

In an alternative embodiment, the type of transistors tying the body to the source and the body to the drain are reversed and are gated by the inverse of the signal gating the body-tied n-channel transistor, as illustrated in FIG. 5A. This is advantageous because it allows the body voltage to be pulled up through the p-channel transistor 33 and pulled down through the n-channel transistor 32. This will be referred to herein as a "smarter" BTS and "smarter" BTD configuration.

Figure 5B:
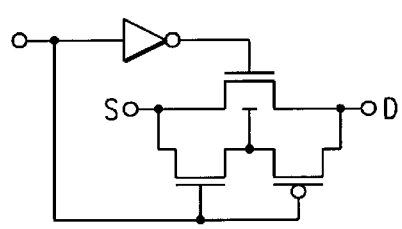
Figure 5C:
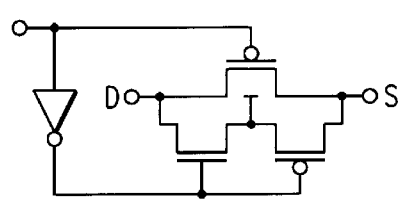
FIGS. 5C–D are p-channel transistors including the present invention.
Figure 5D:
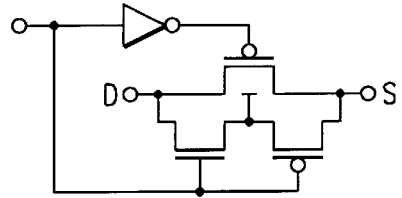
Figure 6:
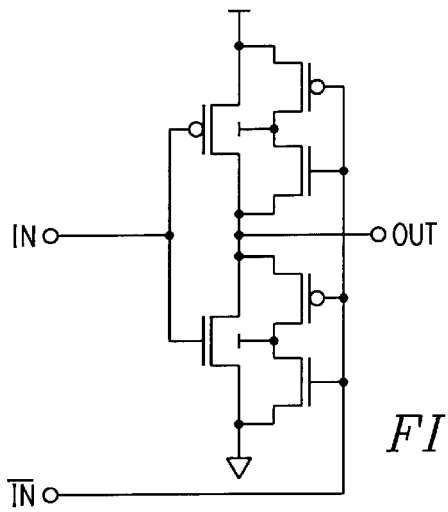
FIG. 6 is an inverter including the present invention.

Since this would be a lot of overhead for small transistors, it is particularly suitable for large drivers, e.g., clock drivers or I/O buffers. A series of inverters is often employed to ramp up to these large drivers, in which case the inverse signal would be available ahead of time as shown in FIG. 5B. The analogous circuits for a p-channel transistor are illustrated in FIGS. 5C–D. FIG. 6 illustrates an inverter employing these principles.

Figure 7A:
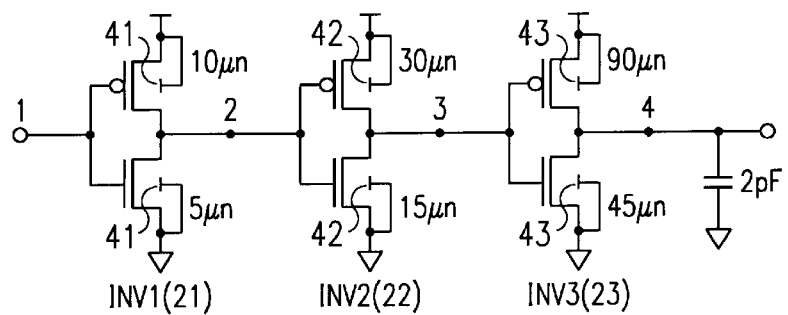
FIGS. 7A–C are circuits used in simulation of a configuration of the present invention contrasted with the prior art.
Figure 7B:
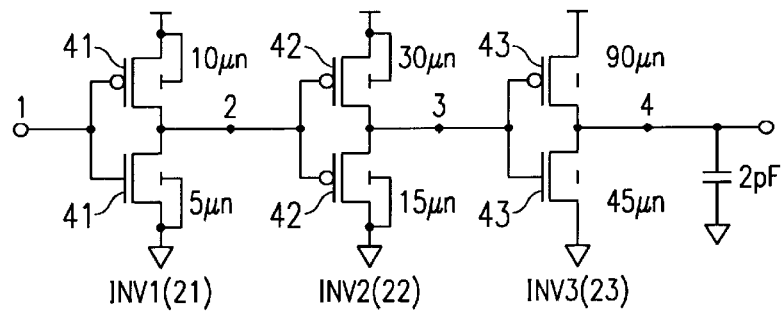
Figure 7C:
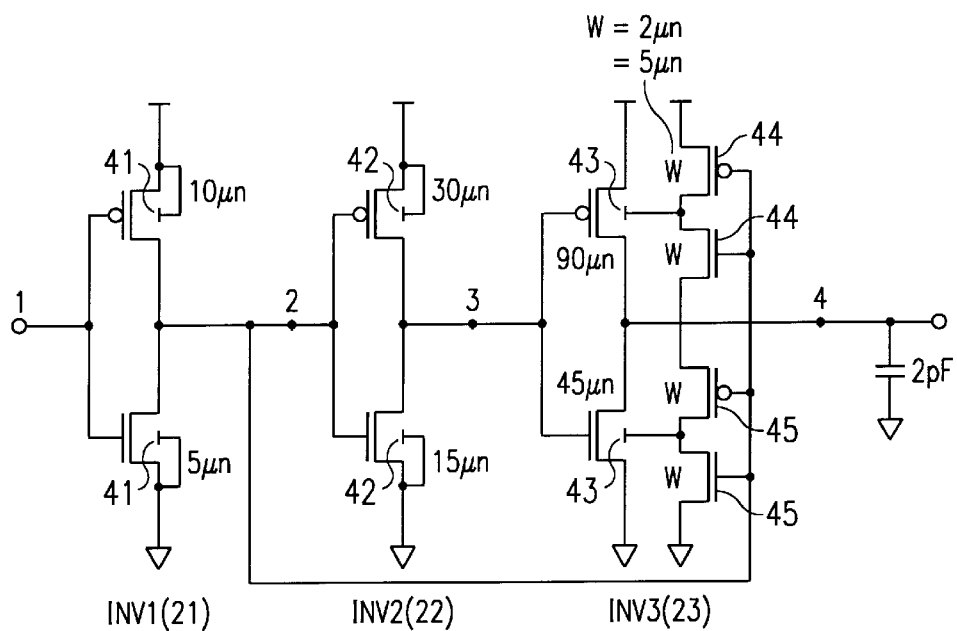

A computerized simulation was performed on the circuits shown in FIGS. 7A–C. Four variations were simulated. In the first variation, case 1, each transistor body was tied to its respective source as shown in FIG. 7A. In the second variation, case 2, the body of INV1 41 and the body of INV2 42 were tied to its source while the body of INV3 43 was left floating (1 GigaOhm) as shown in FIG. 7B. In the third variation, case 3, the bodies of INV1 and INV2 41 and 42 were tied to the source and the body of INV3 43 was tied as shown in FIG. 7C where the widths of body-control transistors 44 and 45 were 2 micrometers. In the fourth variation, case 4, the bodies of INV1 41 and INV2 42 are tied to its source and the body of INV3 43 is tied as shown in FIG. 7C, where the widths of the body-control transistors 44 and 45 were 5 micrometers. Transitions were marked when node voltages hit low (0.1V) or high (0.9V) potentials.

|  | Case 1 | Case 2 | Case 3 | Case 4 |
|---|---|---|---|---|
| Node 1 | 5.19 ns | 5.19 ns | 5.19 ns | 5.19 ns |
| Node 2 | 5.6 ns | 5.62 ns | 5.66 ns | 5.76 ns |
| Node 3 | 5.76 ns | 5.76 ns | 5.79 ns | 5.86 ns |
| Node 4 | 6.78 ns | 6.55 ns | 6.27 ns | 6.27 ns |

The simulation was re-run with the widths (W) of the p-channel body control transistors 44 of FIG. 7C being 4 micrometers and the widths (W) of the n-channel body control transistors 45 being 2 micrometers for both primary n-channel and p-channel transistors 43 (W's=45/90 micrometers). Data in the table shown below was generated from a run at 0.8V, marking transitions at their mid-points (0.4V). In the table below, the "IN" time is measured at Node 3 and the "OUT" time is measured at Node 4, with the transition time for the last stage (INV3) being the difference between the two. Again, the bodies are fixed to the rail voltages for stages 1 and 2 (INV1 and INV2). For stage 3 (INV3), the bodies are first fixed as in FIG. 7A, then floating as in FIG. 7B, then "smarter" as in FIG. 7C, with 4 micrometer and 2 micrometer widths for body control transistors 44 and 45 respectively. The arrows indicate the direction of the Node 3 transition. All times are in nanoseconds.

| Stage 3: | | | | | | | | |
|---|---|---|---|---|---|---|---|---|
| Fixed | | Float | | Smarter | | Transition τ for last stage. | | |
| In | Out | In | Out | In | Out | Fixed | Float | Smarter |
| ↑ 0.82 | 1.7 | 0.82 | 1.43 | 0.87 | 1.27 | 0.88 | 0.61 | 0.4 |
| ↓ 4.07 | 5.4 | 4.05 | 5.0 | 4.15 | 4.65 | 1.33 | 0.95 | 0.5 |
| ↑ 6.8 | 7.6* | 6.8 | 7.4 | 6.87 | 7.28 | 0.8* | 0.6 | 0.41 |
| ↓ 10.07 | 11.4 | 10.05 | 11.0 | 10.17 | 10.65 | 1.33 | 0.95 | 0.48 |

* This time is not valid because the signal did not reach 0.8V before reversing direction.

Figure 8:
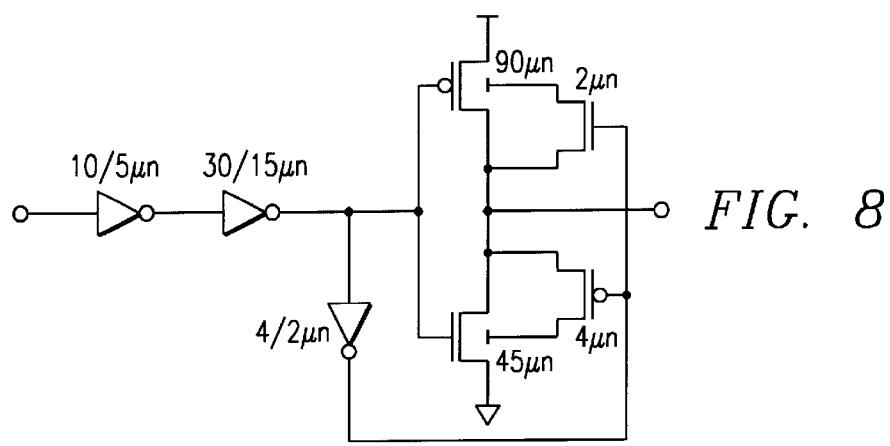
FIG. 8 is a circuit used in simulation of a configuration of the present invention.

A simulation was also run for a case in which an extra inverter was used to modulate the gate voltage for the body control transistors, as shown in FIG. 8. The resulting delay was between that for the fixed and floating body configurations. This configuration could be worth while if there are reasons not to want the node to float, e.g., low breakdown concerns or hysteresis.

Additional simulations give even faster responses using "smarter" body-tied-to-drain transistors but leaving out the "smarter" body-tied-to-source transistors. Simulations using "smart" body-tied-to-source and drain, i.e., body tie transistor of opposite type and gated by same node as primary transistor, using the same VT's as primary transistor, give results faster than float, but slower than the "smarter."

Using the "smarter" body-tied-to-drain configuration on the second stage as well as on the third stage also produces a significant improvement in switching speed. The two combined stages transition approximately 0.3 to 0.5 nsec faster in this configuration.

VT Modulation Using Subsequent Output

The present teachings involve tying the bodies of primary transistors to their respective sources or drains using transistors gated to the inverse of the primary transistor input signal. This signal is derived either from the output of an inverter added between the primary transistor gate and the body-tie transistor, or preferably from an earlier stage in the case of series-connected inverters.

Figure 20:
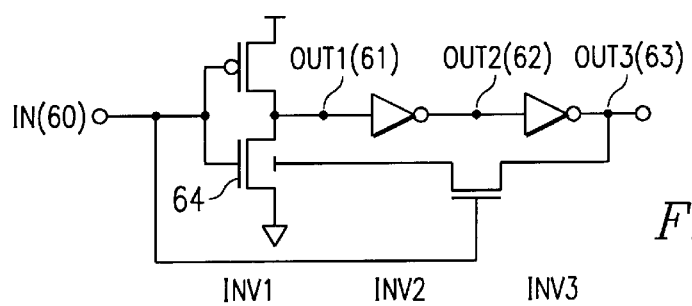
FIG. 20 shows the body of a transistor tied to a subsequent output.
Figure 21:
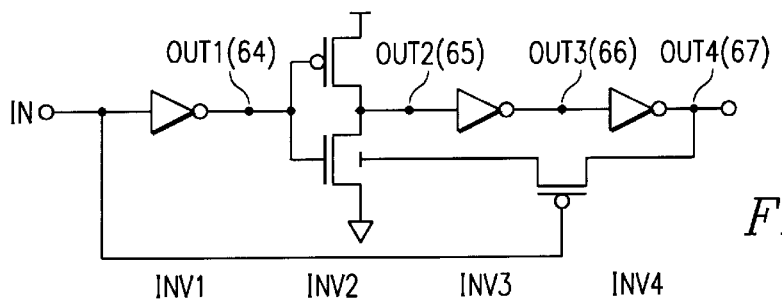
FIG. 21 shows both the previous input and the subsequent output being used together to regulate body voltage.

Another alternative embodiment is to tie a subsequent output, as shown in FIG. 20, to the bodies of primary transistors in an inverter. This is advantageous because when IN 60 transitions from low to high, OUT3 63 remains high longer than does OUT1 61. Tying the body of the primary n-channel transistor 64 to OUT3 63 keeps the threshold voltage of the n-channel transistor 64 low for the full transition of OUT1 61. The threshold voltage of the n-channel transistor 64 will remain low until the signal propagates to INV3. In a circuit with four inverter stages in a row, both previous input and subsequent output can be used together, as shown in FIG. 21. Previous input OUT2 65 and immediate output OUT4 67 are used to control the body voltage of the transistors comprising INV4.

Controlling Body Voltage When Stand-by States are Known

Figure 22:
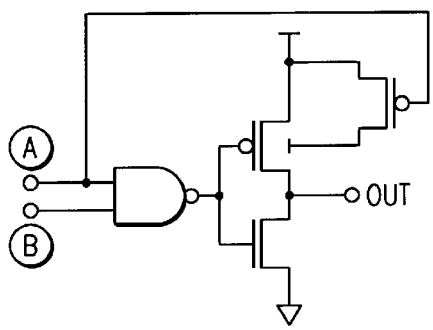
FIGS. 22–24 illustrate circuits which will work well to reduce leakage in the inverter.

The circuit of FIG. 22 effectively reduces leakage in the inverter if it is known that input A will be low in standby. This simplifies the circuit by providing control of the p-channel body voltage using only one of the two inputs. Note that use of both inputs will be required to pull the p-channel body voltage to OUT if a transistor is added tying body-to-drain (for faster pull-up of the output signal OUT).

Figure 23:
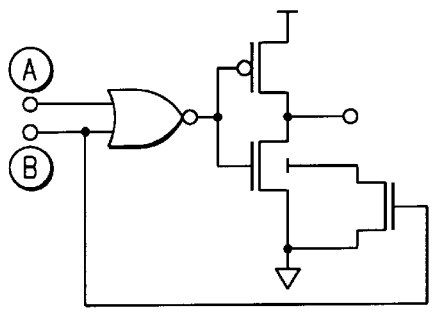
Figure 24:
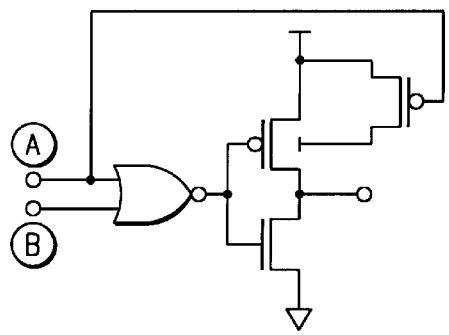
Figure 30:
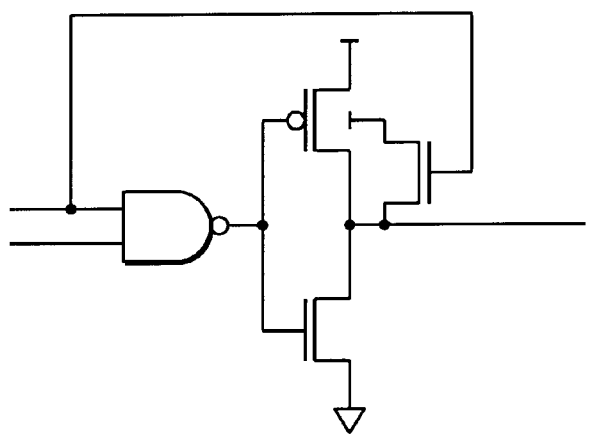
FIG. 30 shows another example of a circuit that will reduce leakage in the inverter.

FIG. 23 shows a similar circuit where it is known that input B will be high in standby. If it is known that both inputs A and B will be low in standby, the circuit of FIG. 24 may be used instead. Similarly, a precursor signal may be chosen to gate the body-tie transistor based on the knowledge that the chosen precursor signal is in the critical timing path. In some cases, this can be speculative in that either the input to the drive transistor may not switch, or the output of the logic gate containing the drive transistor may not switch, depending on the state of other signals. The circuit in FIG. 30 is an example of the latter. Similarly, a precursor signal may be chosen to gate the body-tie transistor based on the knowledge of the relationship of the precursor signals.

Alternative Embodiments for Controlling Body Voltage

Figure 9:
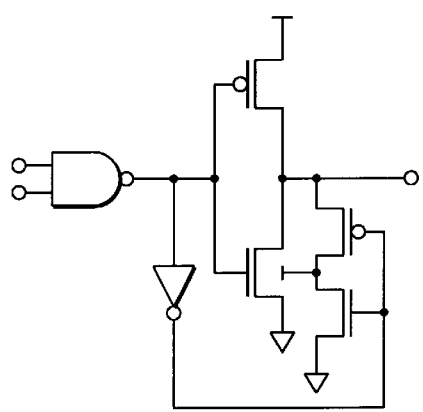
FIG. 9 illustrates a circuit having an inverter added where the first stage is not an inverter.
Figure 10:
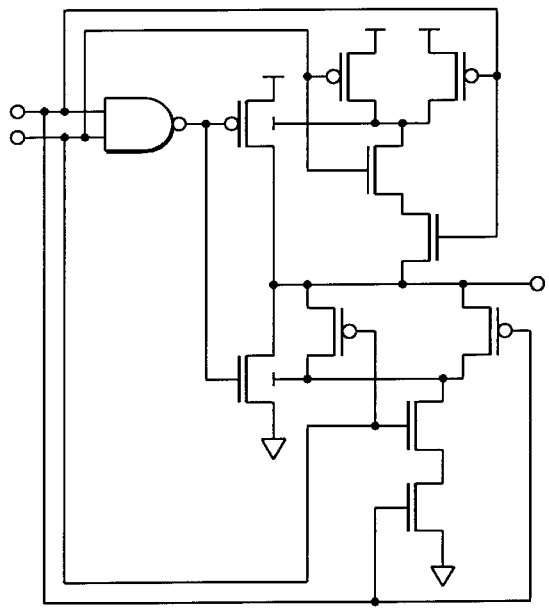
FIG. 10 is an alternative to the circuit of FIG. 9 in which logic is added to the body connections.

While the present teachings have been disclosed primarily with reference to the CMOS inverter, they obviously provide advantageous methods for controlling the body voltage of transistors in many other applications. Transistors used to tie body-to-drain function to increase transition speeds, and transistors used to tie body-to-source decrease substrate current leakage. Either can be used independently. When the input stage is not an inverter, then an inverter or other logic can be added, as illustrated in FIGS. 9–10.

Figure 27:
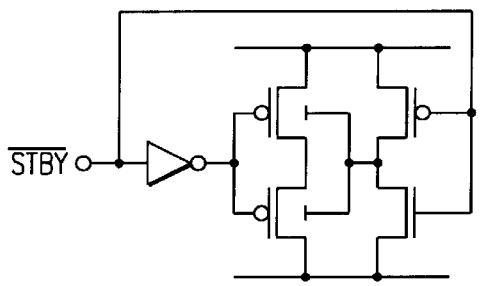
Figure 28:
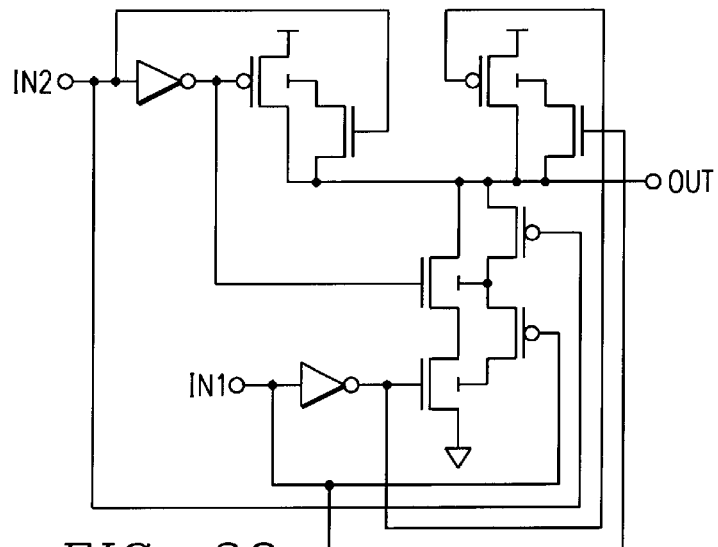
FIGS. 28 and 29 illustrate circuits which apply the principles of the present invention to complex logic gates.
Figure 29:
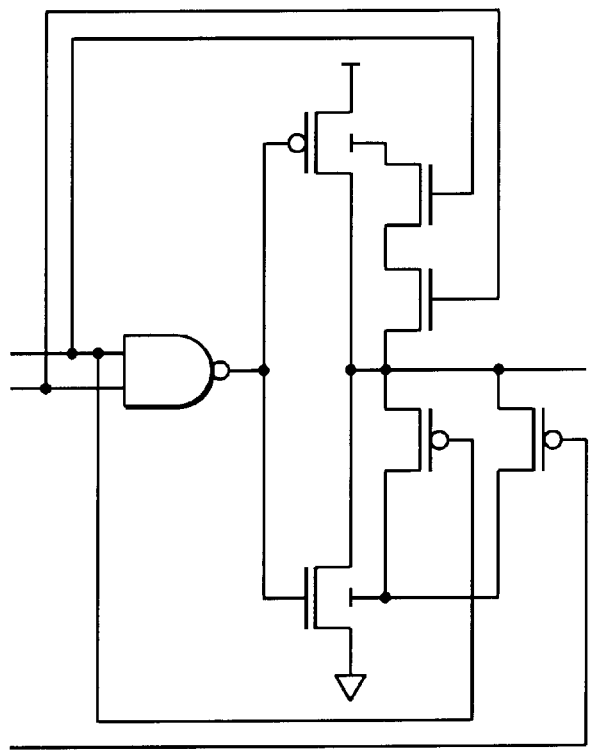

The circuit of FIG. 28 applies the principles of the present teachings to complex logic gates. If the input is not from inverters, then more complex logic can be used in the body-to-drain connection, as shown in the circuit of FIG. 29. In an alternative embodiment using dual-rail logic, the complement of the input could be used to gate the connector of body to drain. When the circuits of FIGS. 27 and 28 are applied to bulk transistors, it may be preferred to only modulate the body potential of the p-channel transistors that have an isolated well. Triple well technology would be necessary to modulate both individual n-channel and individual p-channel bodies in the same circuit. In the case of a bulk dual well implementation, it may be preferable to only modulate the well of the p-channel transistor because it typically has only half the drive of an n-channel transistor, thus more may be gained by boosting its drive.

Figure 11:
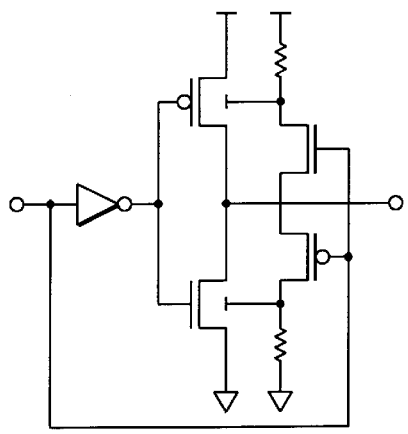
FIGS. 11–13 are three examples of circuits having body tied to drain and a resistive contact of body to source.
Figure 12:
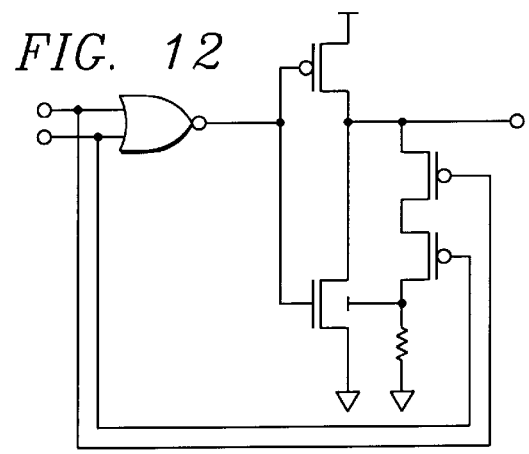
Figure 13:
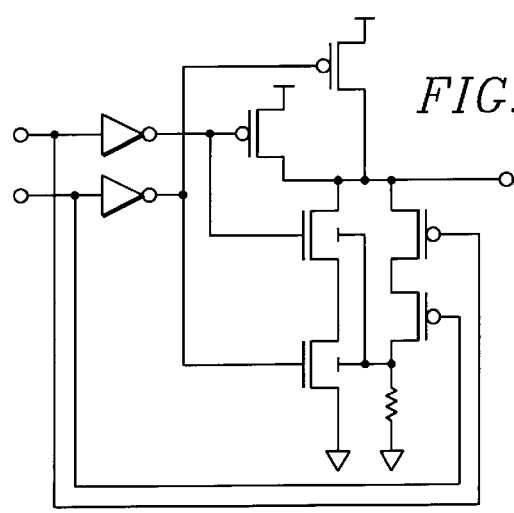

In addition to operating independently, body pull-up and pull-down transistors can be used in combination with other body voltage control means. One such alternative embodiment is to connect the body to drain as disclosed by the present teachings, but to connect the body to source (or rail) using a resistive contact, as shown in FIGS. 11–13. Other combinations are obviously possible.

Figure 14:
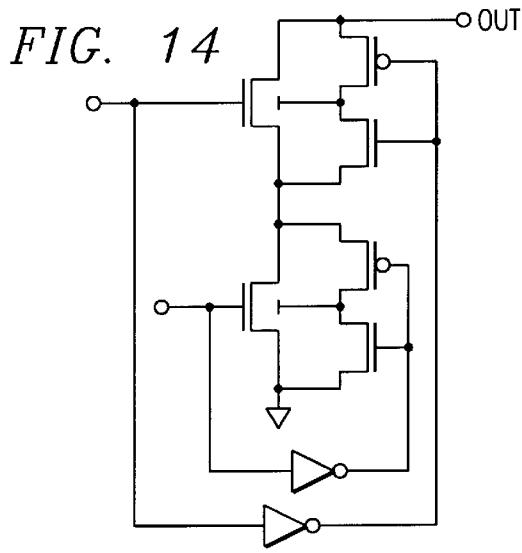
FIG. 14 is an embodiment of the present invention using series transistors.
Figure 15:
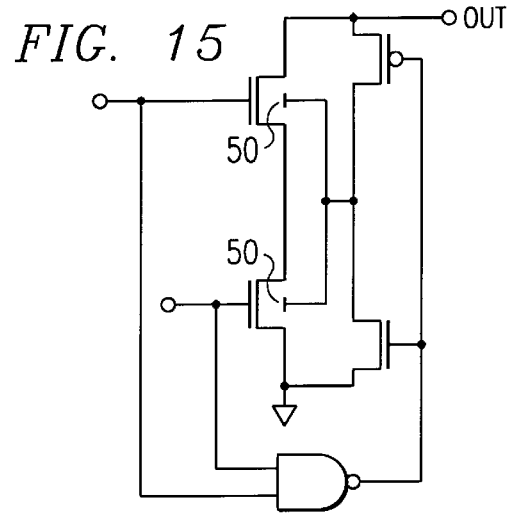
FIG. 15 is another embodiment of the present invention using series transistors.

For series transistors, body voltage control can be accomplished using the circuit of FIG. 14. The simpler circuit of FIG. 15 can be used as well, in which both bodies 50 are tied together and coupled to the output when both inputs are high; otherwise, they are tied to ground. Possible modifications and variations to the circuits in FIG. 14 and FIG. 15 include additional transistors in the logic transistor network, connection to a supply or signal voltage instead of to the source, and use of precursor signals that are precursors to the logic transistors input signal for control of the body voltage.

Location of Body Ties to Dynamic Logic (e.g. Domino)

Figure 16:
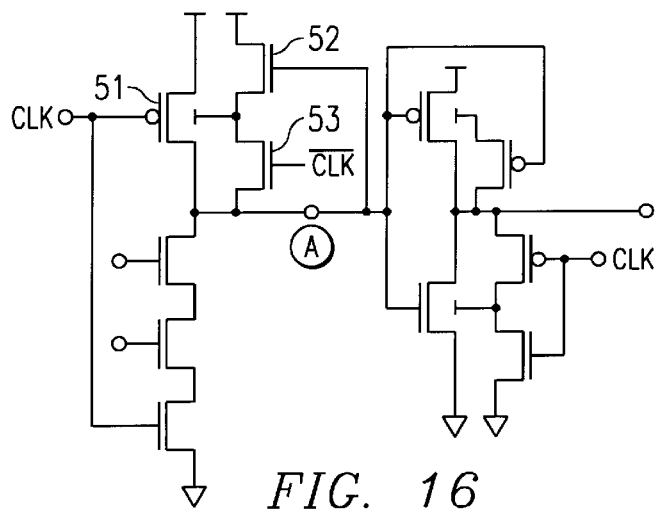
FIG. 16 illustrates the application of body ties to dynamic logic.

FIG. 16 illustrates an alternative embodiment wherein the body potentials of select drive transistors in a two-input AND dynamic logic circuit are modulated using body-tie transistors in accordance with the present teachings. When CLK is at low logic, node A is pre-charged high and OUT is low. When CLK switches high, if both IN1 and IN2 logic transistors are high, node A will transition low and OUT will transition high. If A has transitioned high, then when CLK subsequently transitions low the connection of the body of p-channel transistor 51 to its drain, A, through an n-channel transistor gated by the inverse clock signal will lower the body voltage of 51, thereby lowering the threshold voltage and accelerating the precharge. As A goes high, OUT will go low, which will cause transistor 52 to turn on. This will raise the body voltage of transistor 51 to its source potential, thereby raising the threshold voltage and lowering leakage current when CLK subsequently transitions high. For most applications, this leakage current is not significant enough to necessitate using this body-to-source tie transistor 52. Transistors 51 and 52 may be operated independently.

The body voltage of transistor 55 is controlled by transistors 57 and 58, which are gated by CLK and may be used independently. When CLK transitions high, the body voltage of transistor 55 is tied to its source through n-channel transistor 58, raising the threshold voltage to facilitate the transition of OUT to logic high and reducing leakage in the event that OUT does go high (if IN1 and IN2 are both high). When CLK transitions low, the body of transistor 55 is pulled up to its drain potential (OUT) through p-channel transistor 57. If OUT had transitioned high, the threshold voltage of transistor 55 will be lowered which will speed the transition of transistor 55 from high to low.

The body node of transistor 54 is connected to its source by p-channel transistor 56, which is gated by CLK. This will raise the threshold voltage of transistor 54 when CLK is low, facilitating the transition of OUT from high to low and reducing leakage. The body of transistor 54 is not connected to its drain by an n-channel transistor gated by CLK, since an OUT low-to-high transition may not occur every CLK cycle. If OUT is to remain low, it would be deleterious to connect it to the body of transistor 54. Optionally, the body of transistor 54 could be connected to its drain by a p-channel transistor gated by A (not shown).

Figure 17:
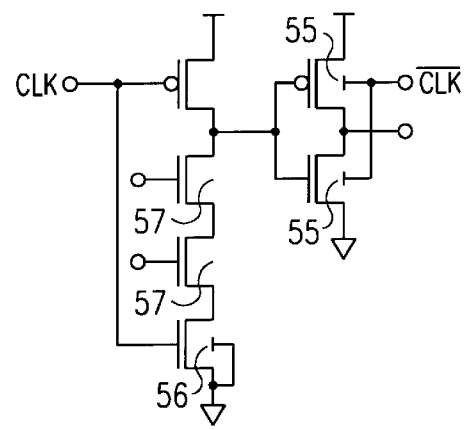
FIG. 17 shows the bodies of an inverter transistor tied directly to CLK-bar.

Also, it may be advantageous to tie CLK or CLK-bar directly to the body of a primary transistor. FIG. 17 illustrates a circuit in which the n-channel transistor 56 gated by CLK has its body tied to source to reduce leakage while the logic n-channel transistors 57 are left with floating bodies. If voltages low enough to enable gate-tied-to-body configurations are used, an improved configuration is possible for the logic stage wherein gate-to-body ties are used for clocked transistors and floating bodies are used for logic transistors. The bodies of inverter transistors 55 can be tied directly to CLK-bar for these low voltages. The advantage of this relative to gate-tied-to-body is that the threshold voltage is modulated in advance of the input switching.

Figure 18:
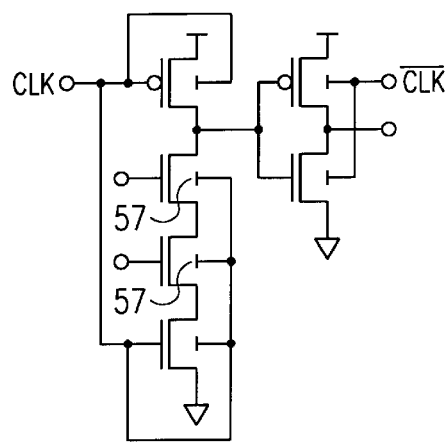
FIG. 18 shows the bodies of logic transistors tied directly to CLK.
Figure 19A:
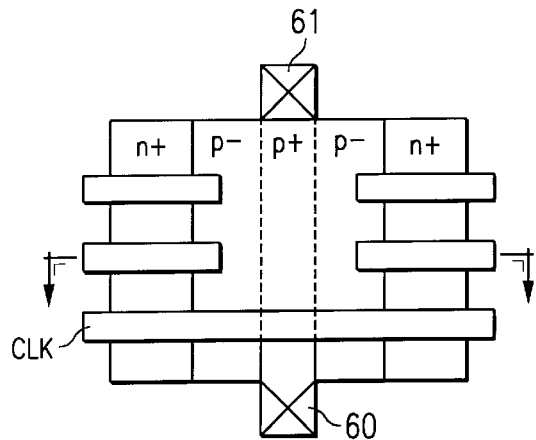
FIGS. 19A–B are top and cross-sectional views, respectively, of a "well-like" structure for implementing the circuit of FIG. 18.
Figure 19B:
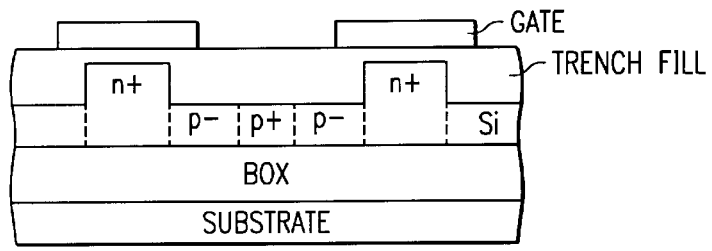

An alternative embodiment is possible wherein the bodies of the logic transistors 57 are connected to CLK as well, as shown in FIG. 18. While this adds capacitance to CLK, it avoids adding capacitance to the signal lines, as would be the case if the logic transistors 57 used a gate-tied-to-body configuration instead. This is also advantageous because that the body voltage is modulated in advance of the input signal. In a physical implementation of FIG. 18, a "well-like" structure could be used to tie CLK to the transistor bodies, as shown in FIGS. 19A,B. The contact to CLK could be formed at either end of the well (60 or 61).

Body Voltage Control in Large Power-Control Transistors

Figure 25:
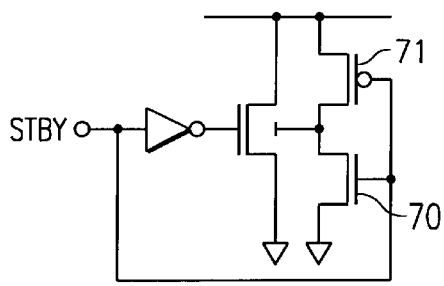
FIG. 25 illustrates use of the invention applied to a standby current shut-off transistor.

Large transistors may be used to control power. There may be an inverter driving the power controlling transistor, so the inverter input would be available to gate the transistor controlling body voltage, as in FIG. 25. The transistor tie to ground 70 functions to raise VT to reduce leakage. The transistor tie to drain 71 functions to boost current drive by lowering VT (assuming drain drifts high in standby). This tie to drain 71 could be left off.

Figure 26:
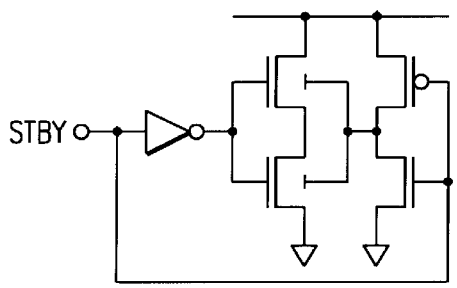
FIGS. 26 and 27 are the n-channel and p-channel versions, respectively, of circuits using two transistors in cascade.

With very low threshold voltages, a transistor may leak even when its body is tied to ground. In this case, two transistors in cascade may be employed, as shown in FIG. 26. The analogous p-channel circuit is shown in FIG. 27.

According to a disclosed class of innovative embodiments, there is provided: An integrated circuit structure, comprising: at least one logic transistor of a first polarity having a body; and at least one body tie transistor of a second polarity; wherein said body tie transistor is connected between the body of said logic transistor and the drain of said logic transistor.

According to a disclosed class of innovative embodiments, there is provided: An integrated circuit structure, comprising: one logic gate comprising at least one logic transistor of a first polarity having a body; and at least one body tie transistor of a second polarity; wherein said body tie transistor is connected between the body of said logic transistor and the drain of said logic transistor and the output of said logic gate.

According to another disclosed class of innovative embodiments, there is provided: An integrated circuit structure, comprising: at least one logic transistor of a first polarity; and at least one body tie transistor of a first polarity; wherein said body tie transistor is connected between the body of said logic transistor and the source of said logic transistor.

According to another disclosed class of innovative embodiments, there is provided: An integrated circuit structure, comprising: at least one logic transistor of a first polarity; and at least one body tie transistor of a first polarity; wherein said body tie transistor is connected between the body of said logic transistor and a supply voltage.

According to another disclosed class of innovative embodiments, there is provided: An integrated circuit structure, comprising: at least one logic transistor; and at least one body tie transistor connected to the body of said logic transistor; wherein said body tie transistor is gated by a first signal that is a precursor to a second signal; and said logic transistor is gated by said second signal.

According to another disclosed class of innovative embodiments, there is provided: An integrated circuit structure, comprising: at least one logic transistor; and at least one body tie transistor connected to the body of said logic transistor; wherein said body tie transistor is gated by a first signal; said first signal is a logical combination of signals that are precursors to a second signal; and said logic transistor is gated by said second signal.

According to another disclosed class of innovative embodiments, there is provided: An integrated circuit structure, comprising: at least one logic transistor; and at least one body tie transistor connected to the body of said logic transistor; wherein: said body tie transistor is gated by a first signal; and the output of said logic transistor is a precursor to said first signal.

According to another disclosed class of innovative embodiments, there is provided: An integrated circuit structure, comprising: at least one logic transistor; wherein: said logic transistor has its body connected to a subsequent signal; and the logic transistor gate signal is a precursor to said subsequent signal.

According to another disclosed class of innovative embodiments, there is provided: An integrated circuit structure, comprising: a plurality of field effect transistors forming a dynamic logic circuit wherein: at least one logic transistor in said dynamic logic circuit has its body potential modulated using a body tie transistor; and said body tie transistor is gated by a clock signal or a derivation of said clock signal.

According to another disclosed class of innovative embodiments, there is provided: An integrated circuit structure, comprising: a plurality of field effect transistors forming a dynamic logic circuit wherein: at least one logic transistor body is connected to a clock signal or a derivation of said clock signal.

According to another disclosed class of innovative embodiments, there is provided: A method of modulating the body voltage of a field effect transistor in a logic circuit using at least one body-tie transistor wherein said body-tie transistor is gated with a signal, chosen from a plurality of precursor signals, based on the known state of said signal in standby.

According to another disclosed class of innovative embodiments, there is provided: An integrated circuit structure, comprising: at least one logic transistor of a first polarity having a body; at least one body tie transistor of a second polarity; and at least one resistor; wherein said body tie transistor is connected between the body of said logic transistor and the drain of said logic transistor; and said resistor is connected between the body of said logic transistor and the source of said logic transistor.

According to another disclosed class of innovative embodiments, there is provided: A transistor layout, comprising: a plurality of first source and drain diffusions of a first conductivity type, and a plurality of second source and drain diffusions of a second conductivity type; a plurality of gate fingers which separate ones of said first diffusions to thereby define first channel regions, and also separate ones of said second diffusions to thereby define second channel regions; a first body-tie transistor, comprising source and drain diffusions of said second conductivity type, and a second body-tie transistor, comprising source and drain diffusions of said first conductivity type; said gate fingers being made of a thin film layer which is also extended to form additional portions laterally separating ones of said source and drain diffusions from additional body tie diffusions, said additional body tie diffusions being connected to said drains of said body-tie transistors; wherein said first and second body-tie transistors have gates which are not connected to said gate fingers.

According to another disclosed class of innovative embodiments, there is provided: A method of modulating the body voltage of a field effect transistor in a logic gate using at least one body-tie transistor wherein said body-tie transistor is gated with a signal chosen from a plurality of precursor signals, based on the known relationship of the precursor signals.

According to another disclosed class of innovative embodiments, there is provided: A method of modulating the body voltage of a field effect transistor in a logic gate using at least one body-tie transistor wherein said body-tie transistor is gated with a signal chosen from a plurality of precursor signals, based on knowledge of the critical timing to path.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

What is claimed is:

1. An integrated circuit structure, comprising:
   at least one logic transistor of a first polarity having a body; and
   at least one body tie transistor of a second polarity;
   wherein said body tie transistor is connected between the body of said logic transistor and a drain of said logic transistor.

2. An integrated circuit structure, comprising:
   at least one logic transistor of a first polarity having a body;
   at least one body tie transistor of a second polarity; and
   at least one resistor;
   wherein said body tie transistor is connected between the body of said logic transistor and the drain of said logic transistor; and
   said resistor is connected between the body of said logic transistor and a supply voltage.

3. An integrated circuit structure, comprising:
   at least one logic transistor; and
   at least one body tie transistor connected to a body of said logic transistor;
   wherein said body tie transistor is gated by a first signal that is a precursor to a second signal; and
   said logic transistor is gated by said second signal.

4. An integrated circuit structure, comprising:
   at least one logic transistor; and
   at least one body tie transistor connected to a body of said logic transistor;
   wherein said body tie transistor is gated by a first signal;
   said first signal is a logical combination of signals that are precursors to a second signal; and
   said logic transistor is gated by said second signal.

5. An integrated circuit structure, comprising:
   a plurality of field effect transistors forming a dynamic logic circuit wherein:
   at least one logic transistor in said dynamic logic circuit has its body potential modulated using a body tie transistor; and
   said body tie transistor is gated by a clock signal or a derivation of said clock signal.

6. An integrated circuit structure, comprising:
   a plurality of field effect transistors forming a dynamic logic circuit wherein:
   at least one logic transistor body is connected to a clock signal or a derivation of said clock signal.

7. A method of modulating the body voltage of a field effect transistor in a dynamic logic circuit using at least one body-tie transistor wherein said body-tie transistor is gated with a signal, chosen from a plurality of precursor signals, based on the known state of said signal in standby.

8. The method of claim 7, wherein the signal is chosen from a plurality of precursor signals based on the known critical timing path.

9. The method of claim 7, wherein the signal is chosen from a plurality of precursor signals based on the known relative timing of the precursor signals.

* * * * *